(12) United States Patent
Uetani et al.

(10) Patent No.: US 6,475,699 B2
(45) Date of Patent: Nov. 5, 2002

(54) CHEMICALLY AMPLIFIED POSITIVE RESIST COMPOSITION

(75) Inventors: Yasunori Uetani, Toyonaka (JP); Seong-Hyeon Kim, Seaul (KR); Yoshiyuki Takata, Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 74 days.

(21) Appl. No.: 09/765,671

(22) Filed: Jan. 22, 2001

(65) Prior Publication Data

US 2001/0039080 A1 Nov. 8, 2001

(30) Foreign Application Priority Data

Jan. 24, 2000 (JP) ........................................ 2000-013848

(51) Int. Cl.[7] ............................................... G03F 7/004
(52) U.S. Cl. .................... 430/270.1; 430/910; 430/905; 430/326
(58) Field of Search ............................... 430/270.1, 910, 430/326, 905

(56) References Cited

U.S. PATENT DOCUMENTS

| | | |
|---|---|---|
| 6,103,450 A | 8/2000 | Choi |
| 6,391,520 B1 * | 5/2002 | Nakano et al. .......... 430/270.1 |

FOREIGN PATENT DOCUMENTS

| | | |
|---|---|---|
| EP | 0794458 A2 | 9/1997 |
| EP | 1000924 A1 | 5/2000 |
| EP | 1048983 A1 | 11/2000 |
| EP | 1085379 A1 | 3/2001 |
| JP | 11305444 A | 7/1998 |

OTHER PUBLICATIONS

Hofer et al., J. Photopolymer Sci. and Tech., vol. 9, No. 3 (1996) pp. 387–398.
Wallow et al., SPIE, vol. 2724 (1996) pp. 355–364.
Iwasa et al., J. Photopolymer Sci. and Tech., vol. 9, No. 3 (1996) pp. 447–456.
Y. Uetani et al., Proceedings of the SPIE, US, SPIE, Bellingham, VA, vol. 3333, No. 1, Feb. 1998, pp. 546–553, XP002136158.

\* cited by examiner

*Primary Examiner*—Rosemary Ashton
(74) *Attorney, Agent, or Firm*—Birch, Stewart, Kolasch & Birch, LLP

(57) ABSTRACT

A chemically amplified positive resist composition excellent in sensitivity and resolution as well as other resist performance characteristics comprising a resin (X) which has a polymeric unit represented by the following formula (I):

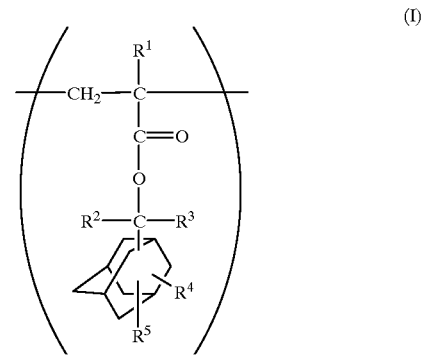

wherein $R^1$ represents hydrogen or methyl, $R^2$ and $R^3$ represent alkyl having 1 to 4 carbon atoms, and $R^4$ and $R^5$ represent hydrogen, hydroxyl or alkyl, polymeric unit represented by the following formula (II):

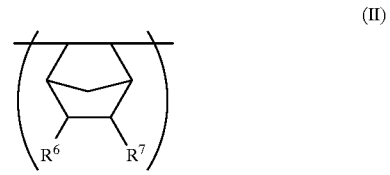

and a polymeric unit derived from unsaturated dicarboxylic acid anhydride selected from maleic anhydride and itaconic anhydride; and an acid generating agent (Y).

7 Claims, No Drawings

CHEMICALLY AMPLIFIED POSITIVE RESIST COMPOSITION

BACKGROUND OF THE INVENTION

The present invention relates to a chemical amplifying type positive resist composition used in the minute processing of a semiconductor.

In general, a lithography process using a resist composition has been adopted in the minute processing of a semiconductor. In lithography, the resolution can be improved with a decrease in wavelength of exposure light in principle as expressed by the equation of Rayleigh's diffraction limited. A g-line with a wavelength of 436 nm, an i-line with a wavelength of 365 nm, and a KrF excimer laser with a wavelength of 248 nm have been adopted as exposure light sources for lithography used in the manufacture of a semiconductor. Thus, the wavelength has become shorter year by year. An ArF excimer laser having a wavelength of 193 nm is considered to be promising as a next-generation exposure light source.

A lens used in an ArF excimer laser exposure machine or an exposure machine using a light-source of shorter wavelength has a shorter lifetime as compared with lenses for conventional exposure light sources. Accordingly, the shorter time required for exposure to ArF excimer laser light is desirable. For this reason, it is necessary to enhance the sensitivity of a resist. Consequently, there has been used a so-called chemical amplifying type resist, which utilizes the catalytic action of an acid generated due to exposure, and contains a resin having a group cleavable by the action of acid.

It is known that, desirably, resins used in a resist for ArF excimer laser exposure have no aromatic ring in order to ensure the transmittance of the resist, but have an alicyclic ring in place of an aromatic ring in order to impart a dry etching resistance thereto. Various kinds of resins such as those described in Journal of Photopolymer Science and Technology, Vol. 9, No. 3, pages 387–398(1996) by D. C. Hofer, are heretofore known as such resins.

However, conventionally known resins have a problem that peeling off of a pattern at development tends to occur due to insufficient adhesion, especially when the polarity is insufficient. Excellent dry etching resistance is also desired in resist since the resist film of resist pattern formed in lithography functions as a protection film at the dry etching process in production of integrated circuit.

An object of the present invention is to provide a chemically amplified positive resist composition containing a resin component and an acid generating agent which is suitable for use in excimer laser lithography utilizing ArF, KrF or the like, and is satisfactory in adhesion to a substrate and dry-etching resistance while exhibiting various excellent resist performance characteristics such as sensitivity and resolution.

The inventors of the present invention have discovered the fact that a chemical amplifying type positive resist composition comprises a resin component having a polymeric unit of a specific structure is excellent in adhesion to a substrate and dry-etching resistance as well as in balance of various resist performance characteristics such as sensitivity and resolution. The present invention has been completed based on this discovery.

SUMMARY OF THE INVENTION

The present invention provides a chemically amplified positive resist composition comprising a resin (X) which, per se, is insoluble or slightly soluble in alkali but becomes soluble in alkali when subjected to an action of acid, and has (a) a polymeric unit, derived from 1-adamantyl-1-alkylalkyl (meth)acrylate, represented by the following formula (I):

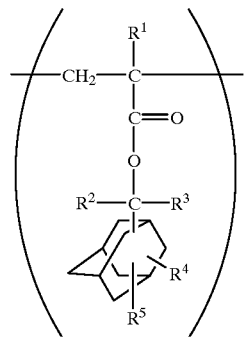

wherein $R^1$ represents hydrogen or methyl, $R^2$ and $R^3$ each independently represent alkyl having 1 to 4 carbon atoms, and $R^4$ and $R^5$ each independently represent hydrogen, hydroxyl or alkyl, (b) polymeric unit, derived from alicyclic olefin, such as norbornene, represented by the following formula (II):

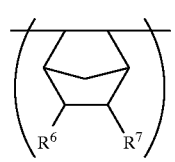

wherein $R^6$ and $R^7$ each independently represent hydrogen, alkyl having 1 to 3 carbon atoms, hydroxyalkyl having 1 to 3 carbon atoms, carboxyl, cyano or a group represented by —$COOR^8$, wherein $R^8$ represents an alcohol residue, or $R^6$ and $R^7$ together form a carboxylic acid anhydride residue represented by —C(=O)OC(=O)—, and (c) a polymeric unit derived from unsaturated dicarboxylic acid anhydride selected from maleic anhydride and itaconic anhydride; and an acid generating agent (Y).

DETAILED DESCRIPTION OF THE PREFERRED EMBODIMENTS

The polymeric unit derived from unsaturated dicarboxylic acid anhydride selected from maleic anhydride and itaconic anhydride is represented by the following formula (III) or (IV):

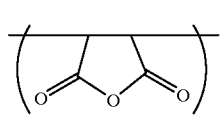

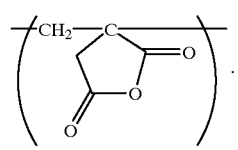

Although use of an alternating copolymer of norbornene and maleic anhydride in a resist for an ArF excimer laser lithography is described in Proc. SPIE, Vol. 2724, pages 355–364 (1996) by T. I. Wallow et al., the resin comprised in the resist composition of the present invention further has the polymeric unit represented by the formula (I), which has a bulky acid cleavable. By the combination of the polymeric unit represented by the formula (I) with the polymeric units represented by the formulae (II) and (III) or (IV), adhesion to a substrate, dry-etching resistance, sensitivity and resolution can be improved.

In the formula (I), $R^1$ is hydrogen or alkyl. When $R^1$ is hydrogen, adhesion to a substrate and dry-etching resistance can be improved particularly. $R^2$ and $R^3$ each independently represent alkyl having 1 to 4 carbon atoms. It is usually advantageous that the alkyl represented by $R^2$ or $R^3$ is straight chain, although the alkyl may be branched. Specific examples of the alkyl represented by $R^2$ or $R^3$ include methyl, ethyl, propyl, isopropyl and butyl. $R^4$ and $R^5$ each independently represent hydrogen, hydroxyl or alkyl, and the group represented by $R^4$ or $R^5$ may be substituted at any positions on the adamantyl ring. The alkyl represented by $R^4$ or $R^5$ may have about 1 to 4 carbon atoms. The adamantyl ring may bond to the carbon linking $R^2$ and $R^3$ in the formula (I) at either 1-position or 2-position. Usually, 1-adamantyl is preferred.

Examples of monomers used for deriving the polymeric unit of formula (I) include
1-(1-adamantyl)-1-methylethyl acrylate,
1-(1-adamantyl)-1-methylethyl methacrylate,
1-(1-adamantyl)-1-ethylpropyl acrylate,
1-(3-hydroxyl-1-adamantyl)-1-methylethyl acrylate, and
1-(3-methyl-1-adamantyl)-1-methylethyl acrylate.

$R^6$ and $R^7$ in the formula (II) each independently represent hydrogen, alkyl having 1 to 3 carbon atoms, hydroxyalkyl having 1 to 3 carbon atoms, carboxyl, cyano or a carboxylate residue represented by —COOR$^8$, wherein $R^8$ represents an alcohol residue. Alternatively, $R^6$ and $R^7$ may together form a carboxylic acid anhydride residue represented by —C(=O)OC(=O)—. Examples of the alkyl represented by $R^6$ and $R^7$ include methyl, ethyl and propyl. Examples of the hydroxyalkyl represented by $R^6$ and $R^7$ include hydroxymethyl and 2-hydroxyethyl. Examples of the alcohol residue represented by $R^8$ include unsubstituted or substituted alkyl having about 1 to 8 carbon atoms and 2-oxoxolane-3- or -4-yl. Examples of the substituents of the substituted alkyl include hydroxyl and an alicyclic hydrocarbon residue. Specific examples of the carboxylate residue, —COOR$^8$, represented by $R^6$ and $R^7$ include methoxycarbonyl, ethoxycarbonyl, 2-hydroxyethoxycarbonyl, tert-butoxycarbonyl, 2-oxoxolane-3-yloxycarbonyl, 2-oxoxolane-4-yloxycarbonyl, 1,1,2-trimethylpropoxycarbonyl, 1-cyclohexyl-1-methylethoxycarbonyl, 1-(4-methylcyclohexyl)-1-methylethoxycarbonyl, and 1-(1-adamantyl)-1-methylethoxycarbonyl.

The resin (X) comprised in the resist composition of the present invention may optionally has another polymeric unit in addition to a polymeric unit represented by the formula (I), a polymeric unit represented by the formula (II) and a polymeric unit represented by the formula (III) or (IV). As the optional polymeric unit, a unit which has no aromatic ring, but has a cyclic structure such as alicyclic ring, lactone ring or a cyclic acid anhydride residue. As the alicyclic ring, an alicyclic hydrocarbon residue, particularly a crosslinked hydrocarbon ring, such as bornane ring, norbornane ring, tricyclodecane ring, tetracyclodecane ring and adamantane ring, is preferred. More specifically, a polymeric unit derived from an alicyclic ester of (meth)acrylic acid, a polymeric unit derived from a vinyl ester or isopropenyl ester of alicyclic carboxylic acid, and the like can be mentioned as an example of the optional polymeric unit. Further, the resin (X) comprised in the resist composition of the present invention may partially contain a free carboxylic acid group or an alcoholic hydrocarbon group. It is particularly preferred for improving adhesion to the substrate and dry-etching resistance that the resin (X) contains a polymeric unit, derived from 1-adamantyl (meth)acrylate, represented by the following formula (V):

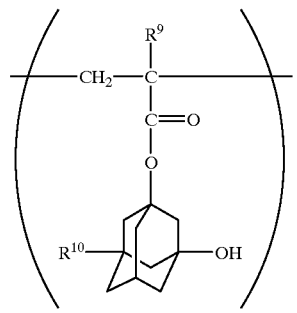

wherein $R^9$ represents hydrogen or methyl and $R^{10}$ represents hydrogen or hydroxyl.

As mentioned above, the resin (X) comprised in the resist composition of the present invention may have a polymeric unit derived from acrylic acid ester or methacrylic acid ester, such as the polymeric unit of formula (I) and, the optional unit, the polymeric unit of formula (V) and other (meth)acrylate. The polymeric unit derived from acrylic acid ester is more preferred than the polymeric unit derived from methacrylic acid ester, since a polymeric unit derived from acrylic acid ester more hardly causes depolymerization, which lowers the molecular weight, on dry-etching step than a polymeric unit derived from methacrylic acid ester does. For example, $R^1$ in the formula (I) is preferably hydrogen and $R^9$ in the formula (V) is preferably hydrogen.

Usually, resins used in chemically amplified positive resist composition, per se, is insoluble or slightly soluble in alkali but becomes soluble in alkali when subjected to an action of acid, since a part of groups in the resin is cleaved by the action of acid. In the resin (X) comprised in the resist composition of the present invention, the ester group in the polymeric unit of formula (I) is cleaved by the action of acid, and the resin (X) becomes soluble in alkali. Therefore, the resist composition of the present invention functions as positive type. If desired, the resin (X) may further have another polymeric unit cleavable by the action of acid.

Various kinds of carboxylic acid ester groups may be a group cleavable by the action of acid in such another polymeric unit. Examples of the carboxylic acid ester groups include alkyl esters having about 1 to 6 carbon atoms such as tert-butylester, acetal type esters such as methoxymethylester, ethoxymethylester, 1-ethoxyethylester, 1-isobutoxyethylester, 1-isopropoxyethylester, 1-ethoxypropylester, 1-(2-methoxyethoxy)ethylester, 1-(2-acetoxyethoxy)ethylester, 1-[2-(1-adamantyloxy)ethoxy] ethylester, 1-[2-(1-adamantancarbonyloxy)ethoxy] ethylester, tetrahydro-2-furylester and tetrahydro-2-pyranylester, and alicyclic ester such as isobornylester. Monomers used for deriving such the carboxylic acid ester groups may be acrylic type monomer, such as acrylate and methacrylate, alicyclic type monomers bonding to a carboxylic acid ester group, such as norbornene carboxylate, tricyclodecene carboxylic acid ester and tetracyclodecene carboxylic acid ester, and alicyclic acid esters in which an acrylic acid or a methacrylic acid and an alicyclic group form an ester group, such as those described in Journal of Photopolymer Science and Technology, vol. 9, No. 3, pages 447–456 (1996) by Iwasa et al.

The resin (X) comprised in the resist composition of the present invention can be produced by a copolymerization of 1-adamantyl-1-alkylalkyl (meth)acrylate from which a polymeric unit of formula (I) is derived;

alicyclic olefin from which a polymeric unit of formula (II) is derived;

unsaturated dicarboxylic acid anhydride selected from maleic anhydride and itaconic anhydride; and optional monomers used if desired.

It is usually preferred that amount of the 1-adamantyl-1-alkylalkyl (meth)acrylate is 5 to 60% by mol, and total amount of the alicyclic olefin and the unsaturated dicarboxylic acid anhydride is 10 to 95% by mol based on total amount of the all monomers used in the copolymerization, although the preferable ranges may vary depending on the kind of radiation used for patterning exposure and the kind of the optional monomers used if desired. Usually, the alicyclic olefin and the unsaturated dicarboxylic acid anhydride form an alternating copolymer.

It is advantageous that total amount of the 1-adamantyl-1-alkylalkyl (meth)acrylate, the alicyclic olefin and the unsaturated dicarboxylic acid anhydride is 40% by mol or more, more preferably 50% by mol or more, based on total amount of the all monomers, that is, including the optional monomers, used in the copolymerization. The amount of the monomer from which a polymeric unit of formula (V) is derived is 60% by mol or less, preferably 50% by mol or less, based on total amount of the all monomers used in the copolymerization.

The copolymerization can be conducted according to a conventional method. For example, the resin (X) can be obtained by dissolving the monomers in an organic solvent, then conducting a polymerization reaction in the presence of a polymerization initiator, such as an azo compound. Examples of the azo compound include 2,2'-azobisisobutyronitrile and 2,2'-azobis(2-methylpropionate). It is advantageous that the reaction product is purified by re-precipitation or the like, after completion of the polymerization reaction.

The acid generating agent which is another component is decomposed to generate an acid by irradiating the component itself or a resist composition including the component with radioactive rays such as light and an electron beam. The acid generated from the acid generating agent acts on the resin to cleave the group which is to be cleaved by the action of an acid present in the resin. Examples of such acid generating agents include onium salt compounds, organic halogen compounds, sulfone compounds, and sulfonate compounds. Specifically, the following compounds can be mentioned:

diphenyliodonium trifluoromethanesulfonate,
4-methoxyphenylphenyliodonium hexafluoroantimonate,
4-mthoxyphenylphenyliodonium trifluoromethanesulfonate,
bis(4-tert-butylphenyl)iodonium tetrafluoroborate,
bis(4-tert-butylphenyl)iodonium hexafluorophosphate,
bis(4-tert-butylphenyl)iodonium hexafluoroantimonate,
bis(4-tert-butylphenyl)iodonium trifluoromethanesulfonate,
triphenylsulfonium hexafluorophosphate,
triphenylsulfonium hexafluoroantimonate,
triphenylsulfonium trifluoromethanesulfonate,
4-methoxyphenyldiphenylsulfonium hexafluoroantimonate,
4-methoxyphenyldiphenylsulfonium trifluoromethanesulfonate,
p-tolyldiphenylsulfonium trifluoromethanesulfonate,
p-tolyldiphenylsulfonium perfluorobutanesulfonate,
p-tolyldiphenylsulfonium perfluorooctanesulfonate,
2,4,6-trimethylphenyldiphenylsulfonium trifluoromethanesulfonate,
4-tert-butylphenyldiphenylsulfonium trifluoromethanesulfonate,
4-phenylthiophenyldiphenylsulfonium hexafluorophosphate,
4-phenylthiophenyldiphenylsulfonium hexafluoroantimonate,
1-(2-naphthoylmethyl)thiolanium hexafluoroantimonate,
1-(2-naphthoylmethyl)thiolanium trifluoromethanesulfonate,
4-hydroxy-1-naphthyldimethylsulfonium hexafluoroantimonate,
4-hydroxy-1-naphthyldimethylsulfonium trifluoromethanesulfonate,
2-methyl-4,6-bis(trichloromethyl)-1,3,5-triazine,
2,4,6-tris(trichloromethyl)-1,3,5-triazine,
2-phenyl-4,6-bis(trichloromethyl)-1,3,5-triazine,
2-(4-chlorophenyl)-4,6-bis(trichloromethyl)-1,3,5-triazine,
2-(4-methoxyphenyl)-4,6-bis(trichloromethyl)-1,3,5-triazine,
2-(4-methoxy-1-naphthyl)-4,6-bis(trichloromethyl)-1,3,5-triazine,
2-(benzo[d][1,3]dioxolane-5-yl)-4,6-bis(trichloromethyl)-1,3,5-triazine,
2-(4-methoxystyryl)-4,6-bis(trichloromethyl)-1,3,5-triazine,
2-(3,4,5-trimethoxystyryl)-4,6-bis(trichloromethyl)-1,3,5-triazine,
2-(3,4-dimethoxystyryl)-4,6-bis(trichloromethyl)-1,3,5-triazine,
2-(2,4-dimethoxystyryl)-4,6-bis(trichloromethyl)-1,3,5-triazine,
2-(2-methoxystyryl)-4,6-bis(trichloromethyl)-1,3,5-triazine,
2-(4-butoxystyryl)-4,6-bis(trichloromethyl)-1,3,5-triazine,
2-(4-pentyloxystyryl)-4,6-bis(trichloromethyl)-1,3,5-triazine,
diphenyl disulfone,
di-p-tolyl disulfone,
bis(phenylsulfonyl)diazomethane,
bis(4-chlorophenylsulfonyl)diazomethane,
bis (p-tolylsulfonyl)diazomethane,
bis(4-tert-butylphenylsulfonyl)diazomethane,
bis(2,4-xylylsulfonyl)diazomethane,
bis(cyclohexylsulfonyl)diazomethane,
(benzoyl) (phenylsulfonyl)diazomethane,
1-benzoyl-1-phenylmethyl p-toluenesulfonate (so-called benzointosylate),
2-benzoyl-2-hydroxy-2-phenylethyl p-toluenesulfonate (so-called α-methylolbenzointosylate),
1,2,3-benzenetriyl trimethanesulfonate,
2,6-dinitrobenzyl p-toluenesulfonate, 2-nitrobenzyl p-toluenesulfonate,
4-nitrobenzyl p-toluenesulfonate,
N-(phenylsulfonyloxy)succinimide,
N-(trifluoromethylsulfonyloxy)succinimide,
N-(trifluoromethylsulfonyloxy)phthalimide,
N-(trifluoromethylsulfonyloxy)-5-norbornene-2,3-dicarboxyimide,
N-(trifluoromethylsulfonyloxy)naphthalimide,
N-(10-camphorsulfonyloxy)naphthalimide, and the like.

It is also known that, generally in a chemical amplifying type positive resist composition, performance deterioration due to the deactivation of an acid associated with leaving after exposure can be reduced by adding basic compounds, especially basic nitrogen-containing organic compounds such as amines as quenchers. It is also preferable in the present invention that such basic compounds are added. Concrete examples of the basic compounds to be used as quenchers include the ones represented by the following formulae:

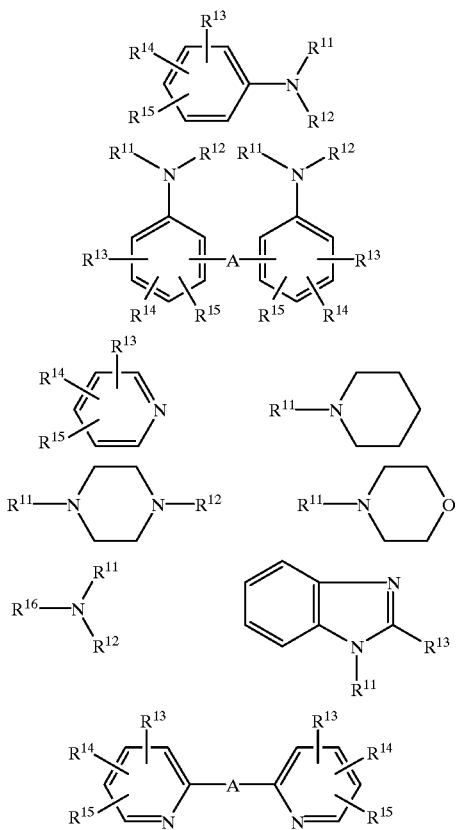

wherein $R^{11}$ and $R^{12}$ represent, independently each other, hydrogen, cycloalkyl, aryl or alkyl which may be optionally substituted with a hydroxyl; $R^{13}$, $R^{14}$ and $R^{15}$, which are same or different from each other, represent hydrogen, cycloalkyl, aryl, alkoxy or alkyl which may be optionally substituted with a hydroxyl; $R^{16}$ represents cycloalkyl or alkyl which may be optionally substituted with a hydroxyl; A represents alkylene, carbonyl or imino. The alkyl represented by $R^{11}$ to $R^{16}$ and alkoxy represented by $R^{13}$ to $R^{15}$ may have about 1 to 6 carbon atoms. The cycloalkyl may have about 5 to 10 carbon atoms and the aryl may have about 6 to 10 carbon atoms. The aryl represented by $R^{11}$ to $R^{15}$ may have about 6 to 10 carbon atoms. The alkylene represented by A may have about 1 to 6 carbon atoms and may be straight-chained or branched.

The resist composition of the present invention preferably contains the resin (X) in an amount in the range of 80 to 99.9% by weight, and the acid generating agent (Y) in an of 0.1 to 20% by weight based on the total amount of the resin (X) and the acid generating agent (Y). When a basic compound is used as a quencher, it is preferably contained in an amount in the range of 0.0001 to 0.1% by weight based on the total solid component weight of the resist composition. The composition may also contain, if required, various additives such as sensitizers, dissolution inhibitors, resins other than resin (X), surfactants, stabilizers, and dyes so far as the objets of the present invention is not harmed.

The resist composition of the present invention generally becomes a resist solution in the state in which the above-described components are dissolved in a solvent to be applied on a substrate such as a silicon wafer. The solvent herein used may be one which dissolves each component, has an appropriate drying rate, and provides a uniform and smooth coating after evaporation of the solvent, and can be one which is generally used in this field. Examples thereof include glycol ether esters such as ethylcellosolve acetate, methylcellosolve acetate, and propylene glycol monomethyl ether acetate; esters such as ethyl lactate, butyl acetate, amyl acetate, and ethyl pyruvate; ketones such as acetone, methyl isobutyl ketone, 2-heptanone, and cyclohexanone; and cyclic esters such as γ-butyrolactone. These solvents can be used alone or in combination of two or more thereof.

The resist film applied on a substrate, and dried is subjected to an exposure treatment for patterning. Then, after a heat-treatment for promoting a protecting deblocking reaction, development by an alkali developer is conducted. The alkali developer herein used can be various kinds of alkaline aqueous solutions used in this field. In general, an aqeous solution of tetramethylammoniumhydroxide or (2-hydroxyethyl)trimethylammoniumhydroxide (so-called colline) is often used.

The present invention will be described in more detail by way of examples, which should not be construed as limiting the scope of the present invention. All parts in examples are by weight unless otherwise stated. The weight-average molecular weight is a value determined from gel permeation chromatography using polystyrene as a reference standard. Resin Synthesis 1 (Synthesis of a 1-(1-adamantyl)-1-methylethyl acrylate/norbornene/maleic anhydride copolymer: Resin A1)

In a reaction vessel were charged 15.5 g of 1-(1-adamantyl)-1-methylethyl acrylate (another name: 1-methyl-1-(tricyclo[3.3.1.1$^{3,7}$]deca-1-yl)ethyl) represented by the following formula:

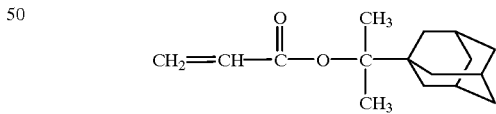

11.4 g of norbornene and 11.8 g of maleic anhydride (molar ratio of 2:4:4). Thereto, 76.5 g of tetrahydrofuran was added to form a monomer solution, and the resultant solution was heated to 65° C. under nitrogen atmosphere. Then, 0.46 g of 2,2'-azobisisobutyronitrile was added and the resulting solution was further stirred for about 8 hours at 65° C. and, then cooled. After cooling, the reaction solution was mixed with a large quantity of methanol to precipitate the polymer product, which was then filtered. The polymer product obtained by the filtration was dissolved in tetrahydrofuran, and the obtained solution was mixed with a large quantity of methanol to re-precipitate the polymer product, which was then filtered. The above procedure from dissolution of the polymer product to re-precipitation was repeated once more in order to purify the product. A copolymer having weight-average molecular weight of about 4,850 and a degree of dispersion (weight-average molecular weight/number-average molecular weight) of 1.42 was obtained at yield of 31.7%. The copolymer thus obtained referred to as resin A1.
Resin Synthesis 2 (Synthesis of a 1-(1-adamantyl)-1-methylethyl acrylate/3-hydroxy-1-adamantyl acrylate/norbornene/maleic anhydride copolymer: Resin A2)

In a reaction vessel were charged 15.0 g of 1-(1-adamantyl)-1-methylethyl acrylate, 20.2 g of 3-hydroxy-1-adamantyl acrylate (another name: 3-hydroxy tricyclo [3.3.1.1$^{3,7}$]deca-1-yl) represented by the following formula:

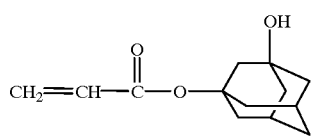

7.1 g of norbornene and 7.4 g of maleic anhydride (molar ratio of 2:3:2.5:2.5). Thereto, methylethylketone, the amount thereof being two times by weight based on the total amount of the monomers, was added to form a monomer solution, and the resultant solution was heated to 80° C. under nitrogen atmosphere. Then, 2,2'-azobisisobutyronitrile, the amount thereof being 2% by mol based on the total amount of the monomers, was added, and the resulting solution was further stirred for about 8 hours at 80° C. and, then cooled. After cooling, the reaction solution was mixed with a large quantity of heptane to precipitate the polymer product, which was then filtered. The polymer product obtained by the filtration was dissolved in methylethylketone, and the obtained solution was mixed with a large quantity of heptane to re-precipitate the polymer product, which was then filtered. The above procedure from dissolution of the polymer product to re-precipitation was repeated once more in order to purify the product. A copolymer having weight-average molecular weight of about 12,570 and a degree of dispersion of 2.22 was obtained at yield of 75.4%. The copolymer thus obtained referred to as resin A2.
Resin Synthesis 3 (Synthesis of a 1-(1-adamantyl)-1-methylethyl acrylate/norbornene/itaconic anhydride copolymer: Resin A3)

In a reaction vessel were charged 10.0 g of 1-(1-adamantyl)-1-methylethyl acrylate, 2.8 g of norbornene and 3.4 g of itaconic anhydride (molar ratio of 4:3:3). Thereto, methylethylketone, the amount thereof being two times by weight based on the total amount of the monomers, was added to form a monomer solution, and the resultant solution was heated to 80° C. under nitrogen atmosphere. Then, 2,2'-azobisisobutyronitrile, the amount thereof being 2% by mol based on the total amount of the monomers, was added, and the resulting solution was further stirred for about 15 hours at 80° C. and, then cooled. After cooling, the reaction solution was mixed with a large quantity of methanol to precipitate the polymer product, which was then filtered. The polymer product obtained by the filtration was dissolved in methylethylketone, and the obtained solution was mixed with a large quantity of methanol to re-precipitate the polymer product, which was then filtered. The above procedure from dissolution of the polymer product to re-precipitation was repeated once more in order to purify the product. A copolymer having weight-average molecular weight of about 5,200 and a degree of dispersion of 1.32 was obtained at yield of 15.3%. The copolymer thus obtained referred to as resin A3.

Resin Synthesis 4 (Synthesis of a tert-butyl 5-norbornene-2-carboxylate/maleic anhydride copolymer: Resin AX for comparison)

In a reaction vessel were charged 15.0 g (77.2 m mol) of tert-butyl 5-norbornene-2-carboxylate and 7.57 g (77.2 m mol) of maleic anhydride. Thereto, 45 g of 1,4-dioxane was added to form a monomer solution, and the resultant solution was heated to 80° C. under nitrogen atmosphere. Then, 0.25g of 2,2'-azobisisobutyronitrile was added, and the resulting solution was further stirred for about 48 hours at 80° C. and, then cooled. After cooling, the reaction solution was mixed with a large quantity of heptane to precipitate the polymer product, which was then filtered. The polymer product obtained by the filtration was dissolved in 1,4-dioxane, and the obtained solution was mixed with a large quantity of heptane to re-precipitate the polymer product, which was then filtered. The above procedure from dissolution of the polymer product to re-precipitation was repeated once more in order to purify the product. A copolymer having weight-average molecular weight of about 4,750 and a degree of dispersion of 1.6 was obtained. The copolymer thus obtained referred to as resin AX.

Resist compositions are prepared using the resins obtained in the above Resin Synthesis examples and the following acid generating agents and quenchers.
Acid Generating Agent
B1: p-tolyldiphenylsulfonium trifluoromethanesulfonate
B2: p-tolyldiphenylsulfonium perfluorooctanesulfonate
B3: cyclohexylmethyl(2-oxocyclohexyl)sulfonium trifluoromethanesulfonate
Quencher
C1: 2,6-diisopropylaniline
C2: 2,6-lutidine

EXAMPLES 1–5 AND COMPARATIVE EXAMPLE

Components listed below were mixed and dissolved. The resultant solution was filtered through a fluorine resin filter having a pore diameter of 0.2 μm to give a resist solution.

| | |
|---|---|
| Resin (listed in Table 1) | 10 parts |
| Acid generating agent | |

(Amounts and kinds thereof are listed in Table 1):
Quencher
(Amounts and kinds thereof are listed in Table 1):

| | |
|---|---|
| Solvent: propyleneglycol monomethylether acetate | 57 parts |
| γ-butyrolactone | 3 parts |

On a silicon wafer, a composition "DUV-30J-14" manufactured by Brewer Co. Ltd. was applied and baked under conditions of 215° C. for 60 seconds so that an organic reflection-preventing membrane having a thickness of 1,600 angstrom was formed on the wafer. The resist solution obtained above was applied by spin-coating on said wafer so that the film thickness after drying was 0.39 μm. After applying the resist solution, the wafer was pre-baked on a direct hotplate at a temperature shown in Table 1, column "PB" for 60 seconds.

The wafer having a resist film formed thereon was irradiated with an ArF eximer stepper ["NSR-ArF", manufactured by Nikon, NA=0.55, σ=0.6] through a line-and-space pattern, changing stepwise the exposure amount. The exposed wafer was subjected to post-exposure baking (PEB) on a hot plate at a temperature shown in Table 1, column "PEB" for 60 seconds. Then the wafer was subjected to paddle development with 2.38% by weight aqueous tetramethyl ammonium hydroxide solution for 60 seconds. The developed bright field pattern was observed by a scanning electron microscope and assessed for the effective sensitivity and the resolution by the following methods:

Effective sensitivity: This is expressed in the minimum amount of exposure which gave 1:1 line-and-space pattern of 0.18 μm.

Resolution: This is expressed in the minimum size which gave line-and-space pattern spitted at the exposure amount of the effective sensitivity.

A bright field pattern is obtained by exposure and development through a reticle comprising an outer frame formed of a chromium layer (lightproof layer) and linear chromium layers (lightproof layers) formed on a surface of a glass substrate (light-transmissive portion). Accordingly, after exposure and development, portions of the resist layer surrounding a line and space pattern is removed with a portion of the resist layer corresponding to the outer frame being left outside the line and space pattern.

TABLE 1

| | Resin | Acid Generating agent (parts) | Quencher (parts) | PB (° C.) | PEB (° C.) | Effective sensitivity (mJ/cm2) | Resolution (μm) |
|---|---|---|---|---|---|---|---|
| Example 1 | A1 | B1 (0.1) | C1 (0.0075) | 140 | 115 | 20 | 0.17 |
| Example 2 | A1 | B2 (0.2) | C1 (0.015) | 120 | 105 | 58 | 0.15 |
| Example 3 | A1 | B2 (0.2) B3 (0.5) | C1 (0.015) C2 (0.01) | 120 | 105 | 38 | 0.17 |
| Example 4 | A2 | B1 (0.1) | C1 (0.0075) | 140 | 130 | 44 | 0.17 |
| Example 5 | A3 | B1 (0.1) | C1 (0.0075) | 140 | 110 | 15 | 0.17 |
| Comparative Example | AX | B1 (0.1) | C1 (0.0075) | 130 | 130 | 82 | 0.18 |

The resist compositions of Examples 1–5 also gave good adhesion to substrate and dry-etching resistance.

The chemically amplified positive resist composition of the present invention is excellent in sensitivity and resolution as well as other resist performance characteristics. Therefore, it is suitable for use in the minute processing of a semiconductor and gives a resist pattern with high performances.

What is claimed is:
1. A chemically amplified positive resist composition comprising a resin (X) which, per se, is insoluble or slightly soluble in alkali but becomes soluble in alkali when subjected to an action of acid, and has (a) a polymeric unit represented by the following formula (I):

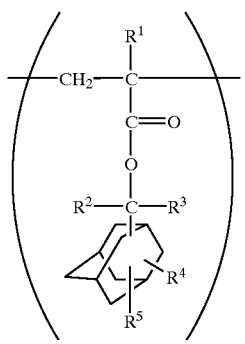

wherein $R^1$ represents hydrogen or methyl, $R^2$ and $R^3$ each independently represent alkyl having 1 to 4 carbon atoms, and $R^4$ and $R^5$ each independently represent hydrogen, hydroxyl or alkyl, wherein the adamantly ring bonds to the carbon linking $R_2$ and $R_3$ at either the 1-position or the 2-position, (b) polymeric unit, derived from an alicyclic olefin, represented by the following formula (II):

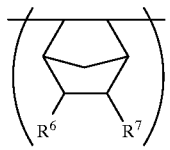

wherein $R^6$ and $R^7$ each independently represent hydrogen, alkyl having 1 to 3 carbon atoms, hydroxyalkyl having 1 to 3 carbon atoms, carboxyl, cyano or a group represented by —COOR$^8$, wherein $R^8$ represents an alcohol residue, or $R^6$ and $R^7$ together form a carboxylic acid anhydride residue represented by —C(=O)OC(=O)—, and (c) a polymeric unit derived from unsaturated dicarboxylic acid anhydride selected from maleic anhydride and itaconic anhydride; and an acid generating agent (Y).

2. The chemically amplified positive resist composition according to claim 1, wherein the adamantly ring bonds to the carbon linking $R_2$ and $R_3$ at the 1-position.

3. The chemically amplified positive resist composition according to claim 1, wherein $R^1$ in the formula (I) is hydrogen.

4. The chemically amplified positive resist composition according to claim 1 which is obtained by a copolymerization of monomers comprising 1-adamantyl-1-alkylalkyl (meth)acrylate from which a polymeric unit of formula (I) is derived;

alicyclic olefin from which a polymeric unit of formula (II) is derived; and unsaturated dicarboxylic acid anhydride selected from maleic anhydride and itaconic anhydride;

wherein amount of the 1-adamantyl-1-alkylalkyl (meth) acrylate is 5 to 60% by mol, and total amount of the alicyclic olefin and the unsaturated dicarboxylic acid anhydride is 10 to 95% by mol based on total amount of the all monomers used in the copolymerization.

5. The chemically amplified positive resist composition according to claim 1 wherein the resin (X) further contains a polymeric unit, derived from 1-adamantyl (meth)acrylate, represented by the following formula (V):

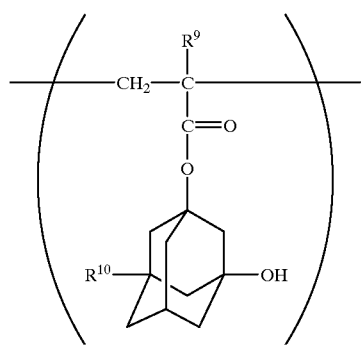
(V)
wherein $R^9$ represents hydrogen or methyl and $R^{10}$ represents hydrogen or hydroxyl.
6. The chemically amplified positive resist composition according to claim 5 wherein R9 in the formula (V) is hydrogen.
7. The chemically amplified positive resist composition according to claim 1 which further comprises an amine compound as a quencher.
* * * * *